United States Patent [19]

Crouse

[11] Patent Number: 4,628,307

[45] Date of Patent: Dec. 9, 1986

[54] FET SWITCH FOR HIGH FREQUENCY SIGNALS

[75] Inventor: William G. Crouse, Raleigh, N.C.

[73] Assignee: International Business Machines Corp., Armonk, N.Y.

[21] Appl. No.: 683,104

[22] Filed: Dec. 18, 1984

[51] Int. Cl.[4] .............................................. H04Q 9/00
[52] U.S. Cl. ................................ 340/825.05; 307/571; 178/70 R
[58] Field of Search ........................... 340/825.05, 825; 370/86, 88, 28, 58; 375/36; 307/574, 544, 571, 550, 581, 448, 560; 178/70 R, 70

[56] References Cited

U.S. PATENT DOCUMENTS

| | | | |
|---|---|---|---|
| 4,255,741 | 3/1981 | Peterson | 340/825.05 |
| 4,417,242 | 11/1983 | Bapst | 340/825.05 |
| 4,435,704 | 3/1984 | Hashimoto | 340/825.01 |
| 4,435,705 | 3/1984 | Stevens | 340/825.05 |
| 4,438,356 | 3/1984 | Fleischer | 307/571 |
| 4,551,634 | 11/1985 | Takahashi et al. | 307/571 |

Primary Examiner—Donald J. Yusko
Attorney, Agent, or Firm—Joscelyn G. Cockburn

[57] ABSTRACT

A solid state switching network includes three FET switches or devices arranged in a substantially "T" (or inverted "T") configuration. The network is controlled so that in an "OFF" or non-conducting state two of the FET switches are "OFF" and one is on. The high "OFF" impedance of the two FETs work against the low "ON" impedance of the third FET to provide an open circuit between the input and output of the switching network. The open circuit has greater isolation than is feasible with conventional circuits. The switching network or module is used in several configurations to couple data terminal equipment (DTE) to a communications highway.

27 Claims, 7 Drawing Figures

FET SWITCH FOR HIGH FREQUENCY SIGNALS

BACKGROUND OF THE INVENTION

1. Field of the Invention

The present invention relates to switching networks in general and more particularly to switching networks that connect data transmission systems with communications media.

2. Prior Art

In the past, numerous types of communications systems have been used to facilitate the exchange of data between Data Terminal Equipment (DTE). The ring or loop communications system is one of the well-known types. Although the loop system can be arranged in many different configurations, the basic configuration usually includes a transmission medium formed into a ring or closed loop. The transmission medium may be coaxial cables, copper wires, fiber optics, etc. The transmission medium is usually prewired into a building. In order to gain access to the transmission medium, a plurality of devices called concentrators are provided. The concentrators are connected via relatively short lengths of transmission medium to respective wall plugs. By attaching a data terminal equipment to the wall plugs, a user is able to transfer information out of the ring or to place information on the ring from whence it is transmitted to a recipient. An example of the prior art ring communications system is described in an article entitled, "IBM 8100 Information System, Communications and Loop Description," Form No. GA27-2883.

Each concentrator is provided with one or more switching devices. The function of the switching device is to insert an attached data terminal equipment into the ring and/or to remove the DTE from the ring. If a DTE is inserted, an electrical signal is fed from the loop into the DTE. The DTE may use the signal or it may be retransmitted onto the transmission medium. Similarly, if the DTE is disconnected, it is bypassed by signals on the loop.

In the past electromechanical relays have been used as the chief device for switching the DTE into and/or out of the loop. Relays often work well for their intended purpose. However, the relays are plagued with several problems. Among the many problems are the following: unreliability, expensive to manufacture and very difficult to switch. The switching problem is augmented when it has to be done, remotely, over long cable lengths. U.S. Pat. Nos. 4,417,242; 4,255,741; 4,435,704; 3,633,166 and 3,458,665 are examples of prior art devices in which some form of electromechanical relays aid in coupling or decoupling a station to a transmission medium.

SUMMARY OF THE INVENTION

It is therefore the general object of the present invention to provide a more efficient switching arrangement for coupling and decoupling stations to/from a transmission medium.

The basic switching arrangement is formed from three solid state switching devices (preferably FETs) configured so that two of the devices are connected in series and the third device is connected in parallel with the series connected devices. A control signal is generated and activates the devices so that if the switching arrangement is in an "ON" state the series connected devices conduct while the parallel connected device is in a non-conductive state. Similarly, when the switching arrangement is in an "OFF" state, the parallel connected device conducts while the series connected devices are in the non-conductive state. A pair of signal transformers couples the switching arrangement into the transmission medium.

In one embodiment of the invention a mix of N channel depletion mode (Nd) FET's (normally closed) and P channel enhancement mode (Pe) FETs (normally open) are used to fabricate normally closed and normally open switching arrangements.

In another feature of the invention a set of normally closed and normally open switching arrangements is fabricated on a single substrate and the resulting module is used to attach a DTE to the communications medium.

The foregoing and other features and advantages of this invention will be more fully described in the accompanying drawings.

DETAILED DESCRIPTION OF THE PREFERRED EMBODIMENT

The switching arrangement of the present invention can be used in any environment where it is required to switch electrical signals. It works well for switching signals in a ring communications system and as such will be described in that environment. However, this should not be construed as a limitation on the scope of the present invention because it is well within the skill of one skilled in the art to use the teachings of the present invention and provide a switching assembly which can be used in several different types of communication systems.

Figure 1:
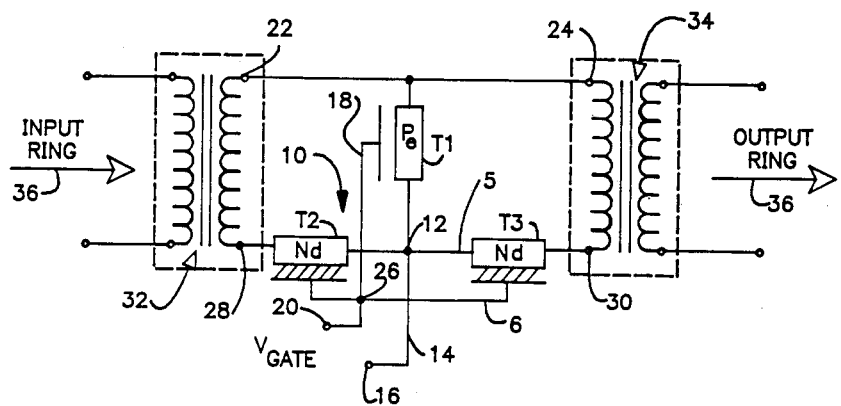
FIG. 1 shows a circuit schematic of a normally "closed" switching arrangement according to the teaching of the present invention.

FIG. 1 shows one type of switching arrangement according to the teaching of the present invention. The switching arrangement identified by numeral 10 represents a normally closed switch. The switching arrangement 10 comprises solid state switching devices T1, T2, and T3. The solid state switching devices are connected into a substantially T-shaped configuration with solid state devices T2 and T3 connected in series by their respective source lead to node 12. Also, the source lead of device T1 is connected to node 12. Similarly, solid state switching device T1 is connected in parallel to the series connected T2 and T3 devices. Conductor 14 interconnects node 12 to node 16. Similarly, conductor 18 interconnects the gate electrode of T1 to node 20. As will be explained subsequently, nodes 16 and 20 form an input terminal to which a control signal identified as $V_{gate}$ is applied for switching or controlling switching arrangement 10. The drain electrode of T1 is tied to nodes 22 and 24, respectively. The gate electrodes of the series connected devices T2 and T3 are tied to a common node 26 which in turn is tied to control node 20. The drain electrode of device T2 is tied to node 28 while the drain electrode of T3 is tied to node 30. It should be noted that nodes 22 and 28 form an input terminal for the switching arrangement while nodes 24 and 30 form an output terminal for the switching arrangement.

Although a plurality of solid state switching devices may be used to represent switching devices T1, T2 and T3 in the preferred embodiment of this invention, the solid state switching devices are FETs. Although the operating characteristics of FET devices are well known and a detailed description of the device will not be given here, it is well worth restating those characteristics which are necessary to enable the present switching arrangement to switch electrical signals into a communications highway and/or to bypass the terminal attached to said highway.

FET devices can be broadly divided into four groups. The four groups are: an N-channel depletion mode device ($N_d$), an N-channel enhancement mode device ($N_e$), a P-channel depletion mode device ($P_d$), and a P-channel enhancement mode device ($P_e$). The N-channel depletion FET is characterized by having a low impedance state with zero volts across the gate to source terminals and switches to a high impedance state when the gate is biased negative with respect to the source. The P-channel enhancement FET has the opposite operating characteristics; namely: high impedance with 0 volts at the gate-to-source terminal and low impedance with the gate positive with respect to the source. For purposes of description, if one thinks of the zero bias as the "NORMAL" or powerless state, then one might think of the N-channel depletion FET as a "Normally On" device. Likewise, one may think of the P-channel enhancement FET as a "Normally Off" FET.

Referring again to FIG. 1, switching arrangement 10 utilizes two types of FETs; namely, N-channel depletion mode (Nd) and P-channel enhancement mode (Pe). The N-channel depletion mode FETs form the series combination of T2 and T3 while the P-channel enhancement mode FET forms the parallel device. By using different types of FETs, a single control voltage $V_{gate}$ can be applied to terminals 16 and 20 to drive the switching arrangement 10. Of course, a single type of FET may be used to fabricate all three devices. However, the gating of these devices would be a little more complicated. In addition, other types of solid state devices may be used to form switching arrangement 10. It should be noted that since devices T2 and T3 are in series AND is conducting when 0 voltage is applied to terminals 16 and 20, then the switching arrangement can be viewed as a normally closed switch. However, when a positive voltage $V_g$ (approximately $-4$ V) is applied to terminals 20 and 16, the state of T2 and T3 changes and becomes non-conductive.

It should be noted that T1 always assumes the opposite state to that of T2 and T3. In other words, whenever T2 and T3 are conducting T1 is in a non-conductive state. Likewise, when T1 is in a conductive state, T2 and T3 are non-conducting. In order to pass electrical signals from the input ring through switching arrangement 10 to the output ring an input transformer identified by numeral 32 couples the input ring to terminals 22 and 28 while an output transformer 34 couples terminals 24 and 30 to the output ring. Arrow 36 shows the direction of signal transmission on the ring.

Figure 2:
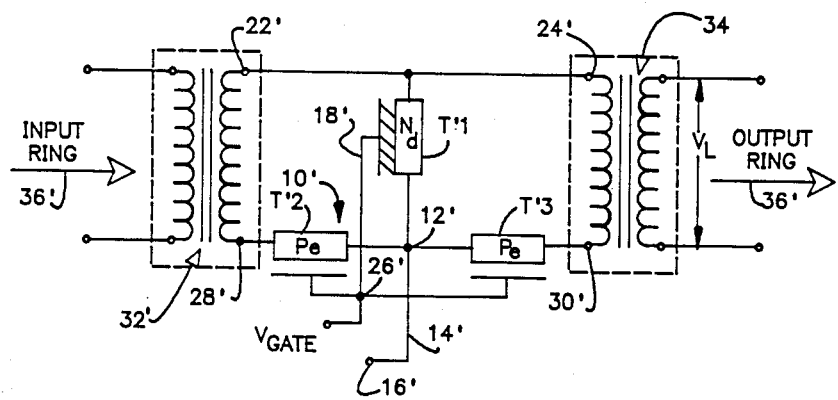
FIG. 2 shows a circuit schematic of a normally "open" switching arrangement according to the teaching of the present invention.

Before describing the operation of switching arrangement 10, it is worthwhile turning to FIG. 2 for the moment. FIG. 2 shows a normally open switching arrangement. Except for changing the position of the FETs the structure and configuration of FIG. 2 are identical to that of FIG. 1. This being the case, only the feature of FIG. 2 which deviates from FIG. 1 and makes the configuration a normally open configuration will be described. The other components that are identical to components in FIG. 1 are identified by similar numerals with a super script being used to label the components or devices of FIG. 2. The devices of FIGS. 1 and 2 which are labeled with common alphanumeric characters and provide the same functions. With reference to FIG. 2, the switching arrangement 10' includes three FET devices T'1, T'2 and T'3. The FET devices are configured in a substantially T configuration. Device T'1 is fabricated from an N-channel depletion (Nd) mode FET. Devices T'2 and T'3 are fabricated from P-channel enhancement (Pe) mode devices. The P-channel enhancement mode devices are connected in series while the N-channel depletion mode device is in parallel with the P-channel enhancement mode devices. In this configuration, with V gate=0 volts T'2 and T'3 are in the open state and provide a high impedance path to signal attempting to pass through the switch from the input side of the ring to the output side. Simultaneously, the N-channel depletion mode device T'1 is in a low impedance state. When the gate is changed into a positive voltage, (say $-4$) T'2 and T'3 change state and conducts while T'1 changes into a high impedance path.

Because of the capacitance associated with the FET's, even though devices T'2 and T'3 are open, a significant amount of signals can feed through the switch. However, by providing the low impedance path with T'1 any voltage appearing at node 12' traverses the low impedance path through T'1 and is not fed through. Similarly, the configuration of FIG. 1 prevents feedthrough when the switch is in the "OFF" state.

The switching arrangements of FIGS. 1 and 2 are well suited for data communications network because the switching arrangements provide a very low resistance path in the forward signal direction and very low coupling of input signal to output when the switching arrangement is in an "off" state.

Figure 5:
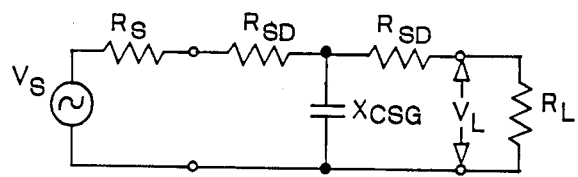
FIG. 5 is an equivalent circuit for the closed condition of the switching arrangement.
Figure 6:
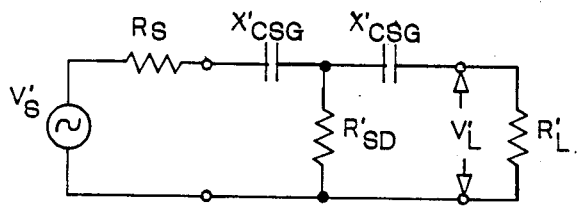
FIG. 6 is an equivalent circuit for the open condition of the switching arrangement.

The superior operating characteristics of the switching arrangement 10 and 10' will be demonstrated by equivalent circuits shown in FIGS. 5 and 6. For purposes of discussion, specific boundary conditions will be used in the equivalent circuits. However, it should be understood that the specific boundary conditions are given for a particular set of operating conditions and it is well within the skill of the art to make minor changes and utilize the disclosed switching arrangement to fit other types of operating conditions.

FIG. 5 is an equivalent circuit for the closed switching arrangement of FIG. 1 or 2. $V_s$ represents the signal source which generates the signal that is propagated in the input ring. $R_s$ represents the characteristic impedance of the line. In the preferred embodiment of this invention $R_s$ is approximately 150 ohms. Rsd represents the respective "on" impedance of T2 and T3. $V_L$ represents the output voltage that exits on the line across switching arrangement 10 and $R_L$ represents the load impedance of the output ring. In the preferred embodiment of this invention $R_L = R_s = 150$ ohms. XcSG represents the impedance provided by the capacitance when T1 is in the non-conducting mode. The characteristic equation of FIG. 5 may be expressed as follows:

$$V_1/V_s \Big|_{X_{csg} >> R_{sd} + 150 \text{ ohms}} \simeq 150 \text{ ohms}/(150 \text{ ohms} + R_{sd} + R_{sd} + 150 \text{ ohms})$$

It is assumed that $X_{csg}$ is much greater than ($R_{sd}$+150 ohms). With this boundary condition signals that propagate through the switch when 0 voltage applied to terminals 16 and 20 (FIG. 1) travel in the low resistance path provided by devices T2 and T3 while the high impedance path provided by T1 is substantially an open circuit.

Stated another way, in the "closed" state T1 is in the high impedance state. T2 and T3 are in the low impedance state. T2 and T3 are in series with the transformers. In one application of the present invention it is required that the "ON" resistance of the switching arrangement (FIG. 1) be approximately 8.8 ohms or less. It is further required that in the "ON" state the insertion loss be less than 0.5 db (approximately 5.9% of 150 ohms). The source and load impedance are each assumed to be 150 ohms. Since the off capacitance of T1 acts as a shunt to signals passing through the switch, if the source to gate capacitance is approximately 66 pf or less, it will place a poll at approximately 32 Mhz or greater. An FET device having 66 pf can be easily manufactured and the boundary conditions for the particular design are met. In a similar fashion boundary requirements for other systems can be met and the size of each component can be designed accordingly.

FIG. 6 shows the equivalent circuit for the open switch arrangement of FIG. 1 or 2. The components in FIG. 6 are identical as the components previously described in FIG. 5. In order to distinguish between the same components in different figures, those in FIG. 6 are identified by super-script. The equivalent equation to describe the equivalent circuit in FIG. 6 is:

$$V_L/V_s \approx (150 \text{ ohms} + X'CS_g)) \times r'_{sd}/(R'_{sd} + X'_{csg} + 150 \text{ ohms})$$

wherein $(X'_{csg} + 150) >> R'_{sd}$

It is assumed that $X'_{csg} + 150$ ohms is much greater than $R'_{sd}$.

In the open state T'1, FIG. 2, is in the low impedance state. T'2 and T'3 are in the high impedance or "off" state. Here the off capacitance of T'2 and T'3 are in series with the transformers similar to the "off" case of FIG. 1. In this case T'1 provides a low impedance shunt to provide additional isolation between the two transformers. The incoming signal has an additional source impedance dictated by the capacitance of T'2. That impedance acts as a voltage divider with the "ON" resistance of T'1 which is quite small. This small voltage developed across T'1 is further attenuated as it passes to the output since capacitance of T'3 is in series with the output load. As will be explained subsequently, T'3 also prevent T'1 from shorting the output for the case in which the output transformer 34' has two sources.

Figure 7:
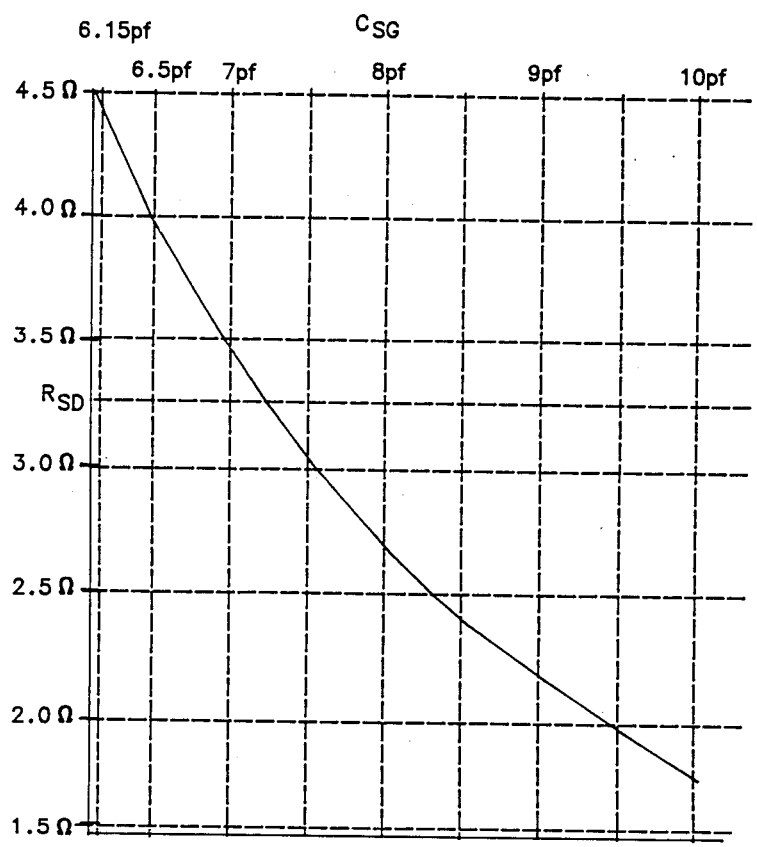
FIG. 7 represents a plot of FET "on" resistance and "off" capacitance that achieve 60 db of isolation in the "T" switching arrangement.

To achieve a predetermined amount of isolation in the open condition, the "off" capacitance of T2, T3, T2', and T3' can be traded off with the "on" resistance of T1 and T1'. FIG. 7 shows a plot for this tradeoff. In the plot the horizontal axis represents the open capacitance $C_{sg}$ while the vertical axis represents the resistant $R_{sd}$. The plot in FIG. 7 was done to achieve an isolation of 60 db. A reasonable and achievable combination would be an "on" resistance of 4 ohms and an "off" capacitance of 6.5 pf. By making dissimilar geometries for T1, T1' as compared to T2, T3 and T2', T3', the isolation can be enhanced. This can be achieved by giving a lower "on" resistance to T1 or T1' with a higher capacitance and T2, T3 and T2', T3' is smaller to achieve a smaller capacitance with some sacrifice to the "on" resistance and thereby the insertion loss.

Figure 3:
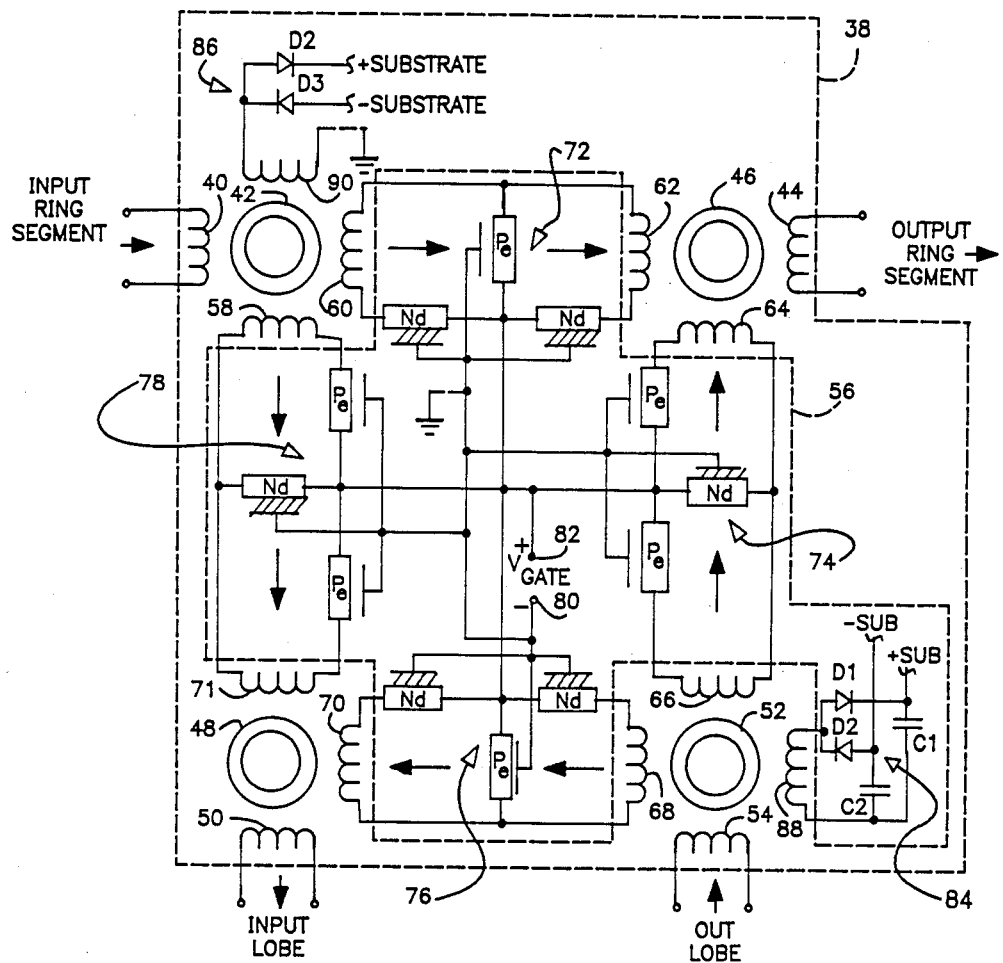
FIG. 3 shows a switching arrangement for interconnecting a station into a ring communications network.

FIG. 3 shows a switching assembly 38 suitable for attaching a data terminal equipment (not shown) to an input ring segment and an output ring segment of a ring communications network. The data terminal equipment (not shown) is coupled to the input lobe and output lobe, respectively. Direction of data transmission is given by the arrows. The input ring segment is connected to coil 40 of input transformer 42. Likewise, the output ring segment is coupled by output coil 44 to output transformer 46. Input data terminal transformer 48 is fitted with a coil 50 that couples the data terminal equipment (not shown) to the data terminal input transformer. Similarly, data terminal output transformer 52 is coupled by coil 54 to the data terminal equipment (not shown).

A switching module identified by numeral 56 is coupled by coils 58–71 to the transformers. The switching module includes four switching arrangements identified by numerals 72–78. The switching arrangements are formed into a substantially quadrilateral configuration. Each switching arrangement includes solid state devices, two of which are connected serially and a third device connected in parallel with the series combination. In the preferred embodiment of this invention, each switching arrangement is a mix of N-channel and P-channel FET device. The switching arrangements 72 and 76 are identical and are formed from two N-channel depletion mode (Nd) devices connected in series with a P-channel enhancement mode (Pe) FET in parallel. This configuration allows switch arrangements 72 and 76 to operate as normally closed switching arrangements. It should be noted that switching arrangements 72 and 76 are identical to the closed switching arrangements described and shown in FIG. 1 above. Likewise, switching devices 74 and 78 are normally open switching arrangements similar to the normally open switching arrangements described and shown in FIG. 2 above.

Still referring to FIG. 3, a conductive lead means ties the gate electrodes of the FET devices to node 80 while another conductive means ties the source electrodes of the FET devices to node 82. By providing the proper control signal (Vgate) at the terminal formed by nodes 80 and 82, each switching arrangement can be controlled to enable the data terminal equipment (not shown) to wrap a signal from its output to its input and/or to place a signal on the loop. Also, by applying the proper $V_{gate}$ signal, the signal on the ring can bypass the data terminal equipment. It should also be noted that although the switching assembly 38 may be positioned at different locations of a wiring installation in the preferred embodiment of this invention switching assembly 38 is positioned in the passive wire concentrator (PWC) of a wiring closet. In fact, the switching assembly 38 can be used to replace the relay described in application Ser. No. 475,780 by T. E. Stammely entitled, "Sub-Milliamp Mechanical Relay Control," and assigned to the assignee of the present invention.

Still referring to FIG. 3, in the preferred embodiment of this invention the switching arrangements 72–78 and biasing circuits 84 and 86 are packaged on a single module. The module comprises of a common substrate (not shown) upon which the switching arrangements 72–78 are fabricated. The biasing circuits 84 and 86 are fabricated from solid state devices and are placed on the common substrate. The function of the biasing circuit is to bias the substrate upon which the switching arrangements are placed. The biasing circuit 84 comprises of diodes D1 and D2. The diodes are poled in opposite directions and are used to charge capacitors C1 and C2, respectively. The charges on C2 and C1 are used to provide the substrate biasing voltage. Coil 88 couples biasing circuit 84 to DTE output transformer 52. Similarly, biasing circuit 86 comprises of diodes D2 and D3 poled in opposite directions and connected by coil 90 to input transformer 42.

Figure 4:
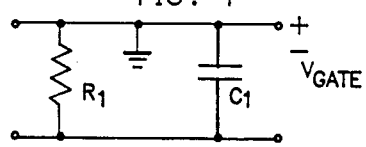
FIG. 4 shows a schematic of a circuit that generates a control signal that drives the switching arrangement of FIG. 3.

FIG. 4 shows a control circuitry which develops the control signal $V_{gate}$. The circuit includes a resistor R1 coupled in parallel with capacitor C1. In operation and as described in the above referenced application (which is incorporated herein by reference) in order to provide gating signal $V_{gate}$ a phantom current in the amount of approximately 1 milliamp is outputted from the attached data terminal equipment. This low current charges up the capacitor C1 until a predetermined voltage is reached whereupon the switching assembly in FIG. 3 is activated.

OPERATION

In operation, the current from the phantom drive circuit sets $V_{gate}$ to approximately 4 V. This 4 V places switching arrangements 72 and 76 in the "open" state and left switching arrangements 78 and 74 in the closed state. As a result of this setting, the signal on the input ring segment is steered down through the input lobe in the direction shown by the arrow into the data terminal equipment (not shown), then back and out through the output lobe to the output ring segment. If the phantom current is discontinued, then $V_{gate}$ is set to 0. This switches the state of switching arrangements 74 and 78 to their "open" condition and switches the state of switching arrangements 72 and 76 to their "closed" conditions. In this state signals at the input ring segment are fed through switching arrangement 72 to the output ring segment. Similarly, signals from the output lobe of an attached DTE are wrapped by switching arrangement 76 into the input lobe and back into the attached data terminal equipment.

Although the invention has been particularly shown and described with reference to a preferred embodiment thereof, it will be understood by those skilled in the art that various changes in form and details may be made therein without departing from the spirit and scope of the invention.

Having thus described my invention, what I claim as new and desired to secure as Letters Patent is as follows:

1. An improved circuit arrangement comprising:
   a control means operable for providing an enabling signal; and
   a switching means being responsive to said enabling signal;
   said switching means comprising a first FET device having a gate electrode, a source electrode and a drain electrode;
   a second FET device having a gate electrode, a source electrode and a drain electrode; and
   a third FET device having a gate electrode, a source electrode and a drain electrode;
   wherein the source electrodes of the FET devices are connected to a first common node so that the first and second FET devices are connected in series and the third FET device is connected in parallel with the serially connected pair and the gate electrodes of the FET devices are connected to a second common node, whereby said first and said second FET devices are made to conduct and the third FET device is made not to conduct when the enabling signal of a first polarity is applied to the first and the second common nodes and said first and said second FET devices are made not to conduct and said third FET device is made to conduct when the enabling signal of a different polarity is applied to the common nodes.

2. The improved circuit arrangement of claim 1 wherein the first and second FET devices are the same type and the third FET device is a different type.

3. The improved circuit arrangement of claim 2 wherein the first and second FET devices are P-channel enhancement mode devices (Pe) and the third FET device is an N-channel depletion mode device.

4. The improved circuit arrangement of claim 2 wherein the first and second FET devices are N-channel depletion mode devices (Nd) and the third FET device is a P-channel enhancement (Pe) mode device.

5. A solid state circuit arrangement comprising:
   a first FET device having a gate electrode, a source electrode and a drain electrode;
   a second FET device having a gate electrode, a source electrode and a drain electrode; said second FET device being coupled in series with first FET device;
   a third FET device having a gate electrode, a source electrode and a drain electrode; said third FET device being coupled in parallel with the first FET device and the second FET device; and
   a single input terminal coupled to the FET devices and operable for conveying energization signals to activate said FET devices said terminal having a first node interconnecting the source electrodes of the FET devices and a second node interconnecting the gate electrode of the FET devices.

6. The solid state circuit arrangement of claim 5 wherein the third FET device includes a $P_e$ device and the first and second FET devices include $N_d$ devices.

7. The solid state circuit arrangement of claim 5 wherein the third FET device includes an Nd device and the first and second FET devices include Pe devices.

8. The solid state circuit arrangement of claims 5 or 6 or 7 wherein the drain electrodes of the first, second and third FETs are being tied to different nodes.

9. A switching arrangement for switching electrical signals comprising:
   an input transformer;
   an output transformer;
   a switching means coupled between the input transformer and the output transformer;
   said switching means including a plurality of switching devices being coupled in a substantially "T"

configuration with a first and a second device connected in series and a third device connected in shunt with the first and second device wherein the devices are responsive to a single enabling signal having at least two polarities with one of said polarities operable to drive the series connected devices into an "on" state while the shunt device is in an "off" state and the other polarity being operable to drive the shunt connected device in an "on" state while the series-connected devices are in an "off" state.

10. The switching arrangement of claim 9 wherein the switching devices include solid state devices.

11. The switching arrangement of claim 10 wherein the solid state devices include FET devices.

12. In a communications system having a transmission medium operable for carrying electrical signals provided from one or more data terminal equipment a switching assembly operable for inserting and/or removing the DTE from the transmission medium comprising:
   a ring input transformer having a first winding connected to the transmission medium;
   a second winding magnetically coupled to the input transformer;
   a first solid state switching means coupled to the second winding;
   a ring output transformer being disposed downstream from the first transformer; said output transformer having a third winding connected to the first solid state switching means, a fourth winding connected to the transmission medium and a fifth winding;
   a second solid state switching means coupled to the fifth winding;
   a lobe output transformer having a sixth winding coupled to the second solid state switching means;
   a lobe output winding and a seventh winding;
   a third solid state switching means coupled to the seventh winding;
   a lobe input transformer having a lobe input winding;
   an eighth winding coupled to the third solid state switching means and a ninth winding;
   a fourth solid state switching means coupled to the ninth winding; and
   a tenth winding operable for coupling the fourth solid state switching means to the ring input transformer.

13. The switching assembly of claim 12 further including means operable for controlling the solid state switching means.

14. The switching assembly of claim 12 wherein the first and third solid state switching means includes normally closed solid state switching arrangements.

15. The switching assembly of claim 12 wherein the second and fourth solid state switching means includes normally open solid state switching arrangements.

16. The switching assembly of claim 14 wherein the solid state switching arrangements include a pair of FET devices connected in series and a third FET device connected in parallel with the pair of FET devices.

17. The switching assembly of claim 16 wherein the series connected FETs are being fabricated from Nd devices and the parallel connected FET is being fabricated from Pe devices.

18. The switching assembly of claim 15 wherein the solid state switching arrangements include a pair of FET devices being connected in series and a third FET device being connected in parallel with the two FET devices.

19. The switching assembly of claim 18 wherein the series connected FETs are being fabricated from Pe devices and the parallel connected FET is being fabricated from Nd devices.

20. In a communications system having a transmission medium operable for carrying electrical signals provided from one or more data terminal equipment (DTE) a switching assembly operable for inserting and/or removing the DTE from the transmission medium comprising:
   a switching means having a solid state substrate with a plurality of solid state switching arrangements thereon; said solid state switching arrangements including four switching circuits arranged into a substantially quadrilateral configuration, with each switching circuit having a pair of solid state devices connected in series with a third solid state device connected in parallel with the pair of solid state devices;
   a control means operable for driving said switching means so that a conductive path and a non-conductive path are being provided simultaneously through the solid state switching arrangements;
   a first coupling means operable for accepting signals from the transmission medium and coupling said signals into the switching means;
   a second coupling means operable for accepting signals from the switching means and coupling said signals onto the transmission medium;
   a third coupling means operable for accepting signals from the DTE and coupling said signal into the switching means; and
   a fourth coupling means operable for accepting signals from the switching means and coupling said signal into the DTE.

21. The switching assembly of claim 20 further including a substrate voltage generating means magnetically coupled to any one of the coupling means and operable for generating a voltage for biasing said substrate.

22. The switching assembly of claim 20 wherein at least two of the switching circuits are normally closed and are being disposed in opposite sides of the quadrilateral configuration and the other two are normally open and are being disposed in opposite sides of the quadrilateral configuration.

23. The switching assembly of claim 22 wherein the series connected FETs and being fabricated from Nd devices and the parallel connected FET is being fabricated from Pe devices.

24. The switching assembly of claim 22 wherein the series connected FETs are being fabricated from Pe devices and the parallel connected FET is being fabricated from Nd devices.

25. A switching adapter for coupling a DTE to a communications highway comprising:
   a substrate;
   a plurality of solid state switching assemblies mounted on said substrate with each switching assembly having two switching devices connected in series and a third in parallel with the two; and conductive lands operable for coupling the plurality of solid state switching assemblies so that when a single enabling signal with a first polarity is being applied to said lands a selected set of the switching assembly is placed in an open state and a selected set is placed in a closed state thereby coupling said DTE to the communications highway and when the enabling signal changes the state of each switching assembly changes thereby decoupling the DTE from the communications highway.

26. The switching adapter of claim 25 wherein the switching devices are FETs.

27. A circuit arrangement comprising:
a first switch means;
a second switch means having a channel type similar to the first switch means connected in series with said first switch means;
a third switch means having a channel type different from the first and second switch means connected in parallel with said first and second switch means; and conductive means operable for interconnecting the switch means and for forming a single control terminal whereby an electrical signal with a first polarity energizes the circuit arrangement so that the series connected switch means is made to conduct while the parallel switch means is in a non-conducting state and when the electrical signal is switched to a second polarity the parallel switch is made to conduct while the series connected switch means is placed in a non-conducting state.

* * * * *